(12) United States Patent
Ono et al.

(10) Patent No.: US 7,479,678 B2
(45) Date of Patent: Jan. 20, 2009

(54) SEMICONDUCTOR ELEMENT AND METHOD OF MANUFACTURING THE SAME

(75) Inventors: Syotaro Ono, Yokohama (JP); Wataru Saito, Kawasaki (JP); Yusuke Kawaguchi, Kanagawa (JP); Yoshihiro Yamaguchi, Saitama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 36 days.

(21) Appl. No.: 11/485,284

(22) Filed: Jul. 13, 2006

(65) Prior Publication Data

US 2007/0018243 A1 Jan. 25, 2007

(30) Foreign Application Priority Data

Jul. 13, 2005 (JP) .............................. 2005-204575

(51) Int. Cl.
*H01L 29/76* (2006.01)
(52) U.S. Cl. ...................... 257/330; 257/409; 257/288; 257/329; 257/E29.028
(58) Field of Classification Search ................ 257/330, 257/288, 329, 341, 327, 409, E29.028, 296, 257/E29.131, E21.384, E29.201; 438/270, 438/259, 589, 212, 271
See application file for complete search history.

(56) References Cited

U.S. PATENT DOCUMENTS 6,621,132 B2 * 9/2003 Onishi et al. ................. 257/409

2003/0073289 A1* 4/2003 Curry et al. .................. 438/270
2004/0026735 A1 2/2004 Suzuki et al.
2005/0035401 A1 2/2005 Yamaguchi et al.

FOREIGN PATENT DOCUMENTS

JP 2001-135819 5/2001
JP 2003115588 A * 4/2003

* cited by examiner

*Primary Examiner*—Minh-Loan T Tran
*Assistant Examiner*—Selim Ahmed
(74) *Attorney, Agent, or Firm*—Oblon, Spivak, McClelland, Maier & Neustadt, P.C.

(57) ABSTRACT

A semiconductor element is provided, comprising a first semiconductor layer of the first conduction type; and a pillar layer including first semiconductor pillars of the first conduction type and second semiconductor pillars of the second conduction type arranged periodically and alternately on the first semiconductor layer. A semiconductor base layer of the second conduction type is formed on the upper surface of the pillar layer, And a second semiconductor layer of the first conduction type is formed on the upper surface of the semiconductor base layer. A control electrode of the trench gate type is formed in a trench, which is formed in depth through the semiconductor base layer to the first semiconductor pillar. The control electrode is tapered such that the width thereof decreases with the distance from a second main electrode toward a first main electrode and the tip thereof locates almost at the center of the first semiconductor pillar.

8 Claims, 8 Drawing Sheets

SEMICONDUCTOR ELEMENT AND METHOD OF MANUFACTURING THE SAME

CROSS REFERENCE TO RELATED APPLICATION

This application is based on and claims the benefit of priority from prior Japanese Patent Application No. 2005-204575, filed on Jul. 13, 2005, the entire contents of which are incorporated herein by reference.

BACKGROUND OF THE INVENTION

1. Field of the Invention

The present invention relates to a semiconductor element and method of manufacturing the same. More particularly, it relates to a semiconductor element having a superjunction structure including p-type pillars and n-type pillars laterally and alternately buried in a drift layer and method of manufacturing the same.

2. Description of the Related Art

A vertical power MOSFET has an on-resistance that greatly depends on the electric resistance of a conduction layer (drift layer). The electric resistance of the drift layer is determined from the impurity concentration thereof. A higher impurity concentration results in a lower on-resistance. The higher impurity concentration though lowers the breakdown voltage across a PN junction formed between the drift layer and a base layer. Therefore, it is not possible to increase the impurity concentration above a limit determined on the basis of the breakdown voltage. In this way, there is a tradeoff between the breakdown voltage and the on-resistance of the element. An improvement in the tradeoff is an important subject to provide a semiconductor element of low power consumption. The tradeoff has a limit determined from material of the element. Overcoming the limit is a way to realize a semiconductor element of low on-resistance.

As an example of the MOSFET to solve this problem, a structure has been known, which is referred to as a superjunction structure that includes p-type pillars and n-type pillars buried laterally and alternately in a drift layer (see JP-A 2001-298181). In the superjunction structure, the amounts of charges (the amounts of impurities) contained in p-type pillars and n-type pillars are made equal to form a pseudo non-doped layer. This is effective to retain a high breakdown voltage and allow current to flow through highly doped n-type pillars, thereby realizing a lower on-resistance than the limit due to the material.

The superjunction structure is a technology to reduce a drift resistance of the drift layer, part of the on-resistance of the element. On the other hand, in a general structure, if the necessary maximum breakdown voltage of the element lowers, the proportion of the drift resistance in the on-resistance lowers. For example, the proportion of the drift resistance in the on-resistance is about 95% in a power MOSFET having a 600 V breakdown voltage. To the contrary, it lowers to 80% in an element having a 100 V breakdown voltage and 40% in an element having a 30 V breakdown voltage. As the necessary maximum breakdown voltage lowers, the proportion of the channel resistance increases while the proportion of the drift resistance in the on-resistance lowers. An increase in channel density inside the element is important to lower the channel resistance. For that purpose, it is effective to narrow the cell pitch between transistors. As for the gate electrode, the cell pitch can be made narrower in a trench gate structure, which includes a gate electrode buried in a trench formed in a base layer, than in a planar gate structure, which includes a planar gate electrode formed on the surface of a base layer with an insulator film interposed therebetween.

When the gate electrode having the trench gate structure is used, a reduction in channel resistance requires arrangement of the gate electrode on the n-type pillar in the superjunction structure without extending off the n-type pillar. A gate electrode extending to the p-type pillar narrows the current path and increases the channel resistance when the element is made conductive. The superjunction structure can be easily depleted on application of a high voltage if it has a reduced pillar pitch. Correspondingly, it is possible to increase the impurity concentrations in the pillars and reduce the on-resistance. Therefore, from the viewpoint of reducing the on-resistance and fine patterning the element, attempts have been made to reduce the pillar pitch in the superjunction structure. In consideration of the increase in channel resistance based on the occurrence of misalignment with the gate electrode as described above, fine patterning of the pillar pitch is limited.

SUMMARY OF THE INVENTION

In one aspect the present invention provides a semiconductor element, comprising: a first semiconductor layer of the first conduction type; a pillar layer including first semiconductor pillars of the first conduction type and second semiconductor pillars of the second conduction type arranged periodically and alternately on the first semiconductor layer: a first main electrode electrically connected to the first semiconductor layer; a semiconductor base layer of the second conduction type formed on the upper surface of the pillar layer; a second semiconductor layer of the first conduction type formed on the upper surface of the semiconductor base layer; a second main electrode electrically connected to the second semiconductor layer and the semiconductor base layer; and a control electrode of the trench gate type formed in a trench, the trench formed in depth through the semiconductor base layer to the first semiconductor pillar, wherein the control electrode is tapered such that the width thereof decreases with the distance from the second main electrode toward the first main electrode and the tip thereof locates almost at the center of the first semiconductor pillar.

In one aspect the present invention provides a method of manufacturing semiconductor elements, comprising: forming a first semiconductor layer of the first conduction type and then forming a semiconductor layer of the second conduction type on the first semiconductor layer; forming trenches almost at equal intervals in the semiconductor layer of the second conduction type; crystal-growing a semiconductor layer of the first conduction type on the semiconductor layer of the second conduction type including the inside of the trench to such an extent as to leave a tapered oblique portion in the trench, thereby forming a pillar layer including first semiconductor pillars composed of the semiconductor layer of the first conduction type and second semiconductor pillars composed of the semiconductor layer of the second conduction type arranged alternately: forming an insulator film on the semiconductor layer of the first conduction type including the oblique portion; forming a conductor layer on the insulator film in the oblique portion, the conductor layer serving as a control electrode; implanting ions of an impurity of the second conduction type and then implanting ions of an impurity of the first conduction type into the semiconductor layer located between portions of the conductor layer; and thermally diffusing the impurities to form a semiconductor base layer of the second conduction type and a second semiconductor layer of the first conduction type on the pillar layer between portions of the conductor layer.

DETAILED DESCRIPTION OF THE INVENTION

An embodiment of the present invention will now be described below with reference to the drawings.

Figure 1:
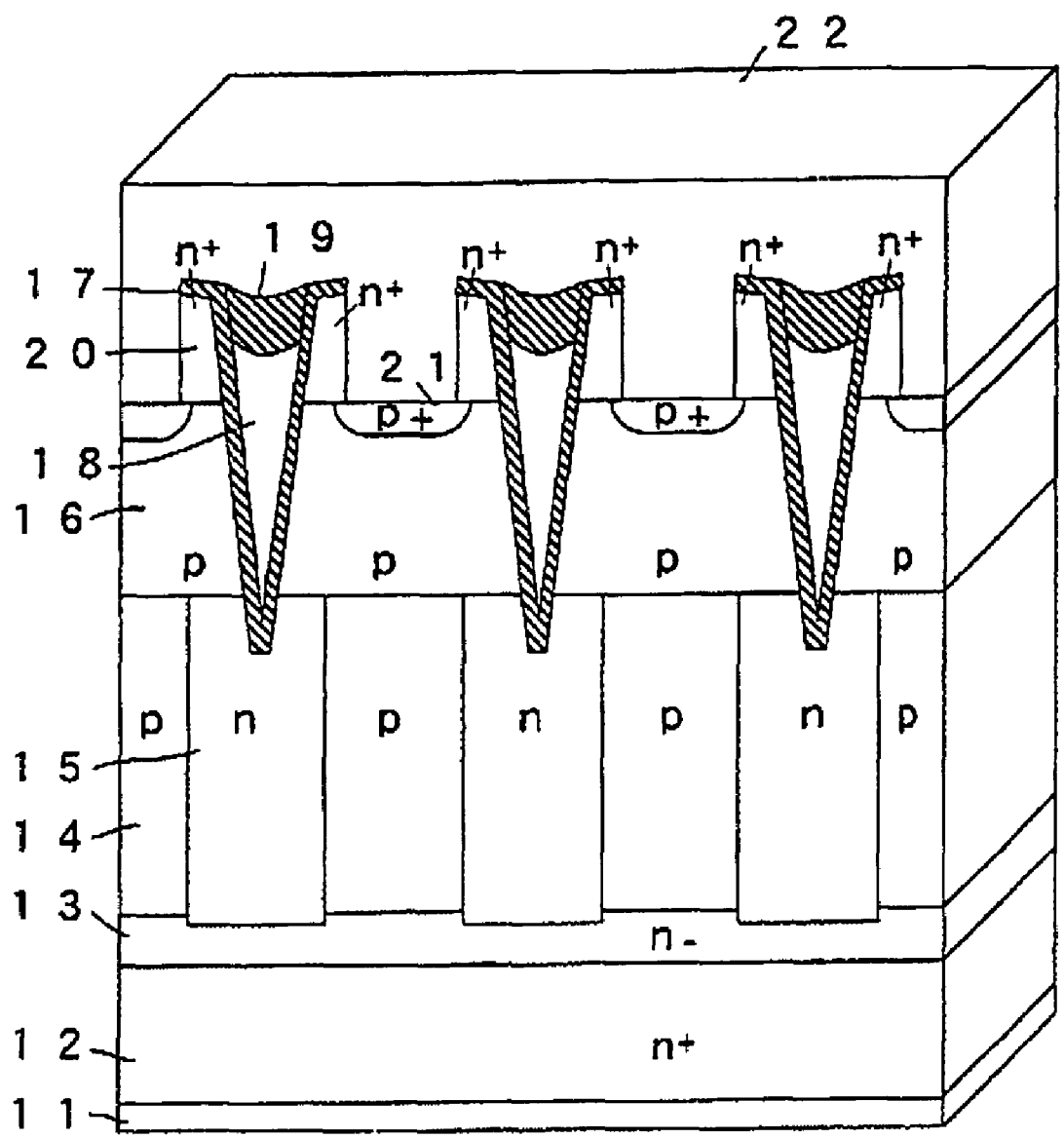
FIG. 1 is a cross-sectional view schematically illustrative of a structure of a power MOSFET according to an embodiment of the present invention.

FIG. 1 is a cross-sectional view schematically illustrative of a structure of a power MOSFET according to an embodiment of the present invention. This MOSFET comprises a drain electrode 11, on which an n$^+$-type drain layer 12, an n$^-$-type epitaxial layer 13, and a pillar layer are formed in turn. The pillar layer has a superjunction structure that includes p-type pillars 14 and n-type pillars 15 formed laterally and alternately. In this case, the p-type pillars 14 and the n-type pillars 15 are formed in stripes in horizontal cross-section.

A p-type semiconductor base layer 16 is formed on the pillar layer. The semiconductor base layer 16 has tapered trenches (oblique portions) formed at equal intervals therethrough to the n-type pillars 15. A gate electrode 18 composed of polysilicon or the like is buried in the trench on an insulator film 17 interposed therein. The gate electrode 18 is formed such that a tip portion thereof locates almost at the center of the n-type pillar 15 through a manufacturing method described later. A further insulator film 19 is formed on the gate electrode 18. On the upper surface of the semiconductor base layer 16 at both sides of the gate electrode 18, an n$^+$-type source diffusion layers 20 are formed. A p$^+$-type contact layer 21 is formed on the upper surface of the p-type base layer 16 sandwiched between the source diffusion layers 20. A source electrode 22 is formed in contact with the contact layer 21 and the source diffusion layer 20. Preferably from the viewpoint of reliability, the source electrode 22 is buried in a trench, which is formed through the source diffusion layer 20 to the p-type base layer 16 as described later. Therefore, the source electrode 22 and the source diffusion layer 20 are formed in contact with each other in an almost vertical plane.

In the structure of this embodiment, the gate electrode 18 is tapered such that the width thereof gradually narrows from the upper side to the lower side, that is, from the source electrode 22 toward the drain electrode 11. In addition, the tip thereof is formed to locate almost at the center of the n-type pillar 15. Moreover, since the trench is formed to have a V-shape, the insulator film 17 is made thicker at the tip of the trench than at other areas. Therefore, compared to a rectangular gate electrode, it is possible to achieve a reduced gate-drain capacitance Qgd and an improved switching loss of MOSFET. A product of the on-resistance Ron and the gate-drain capacitance Qgd can be employed as a performance index of MOSFET, or FOM (Figure Of Merit). Accordingly, this structure is capable of fine patterning the superjunction structure and improving FOM together. It is also possible for this structure to provide a sufficiently wide current path when the element is turned on, thereby preventing the channel resistance and the current spreading resistance between the channel and the n-type pillar 15 from increasing. When the element is turned off, application of the drain voltage causes concentration of the electric field across the inside and the deepest portion in the p-type pillar 14 and no concentration of the electric field at the tip of the gate electrode 18. Therefore, the reliability of the trench gate insulator can be ensured.

Figure 2:
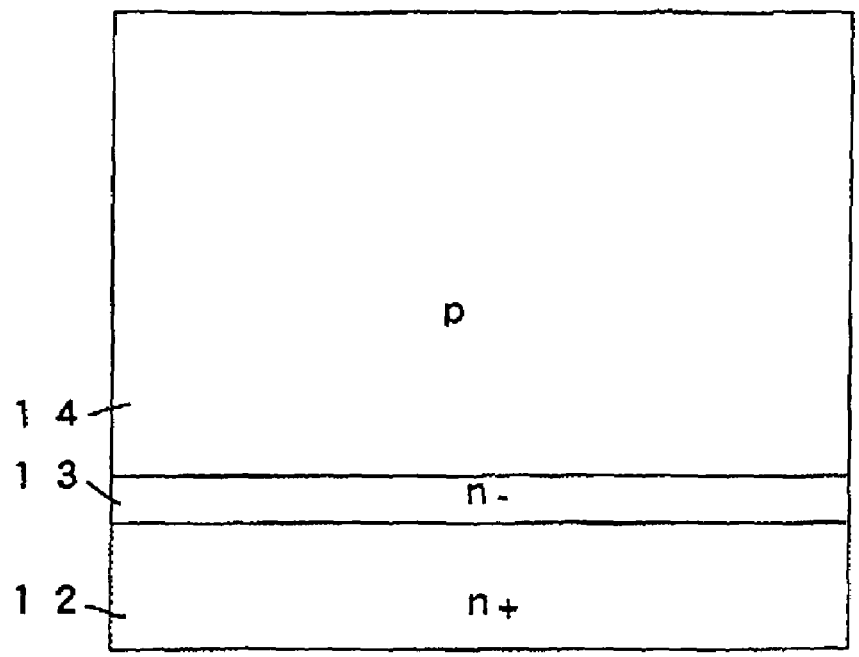
FIG. 2 illustrates a process step of manufacturing the power MOSFET shown in FIG. 1.
Figure 3:
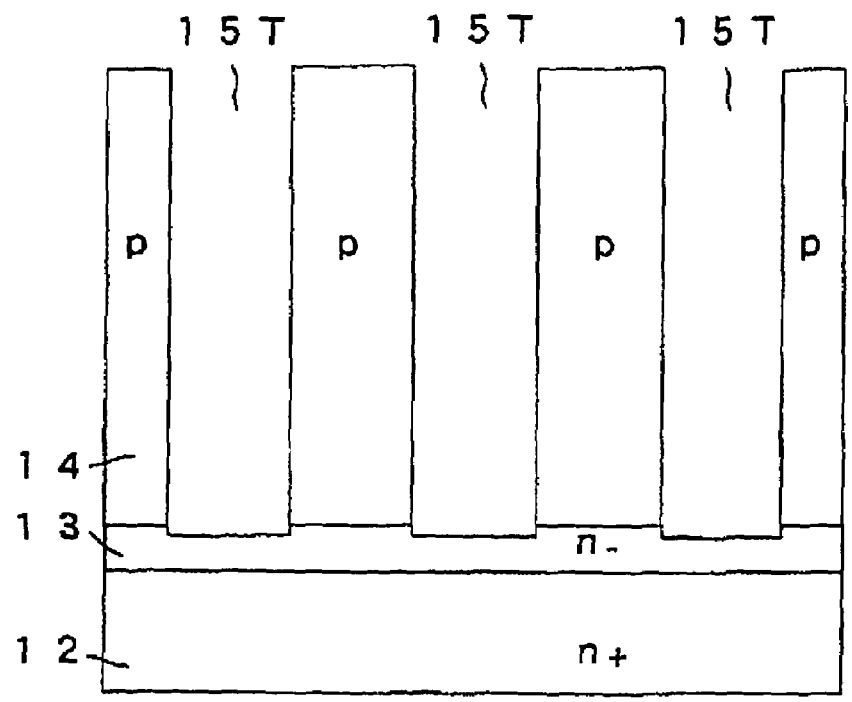
FIG. 3 illustrates a process step of manufacturing the power MOSFET shown in FIG. 1.
Figure 4:
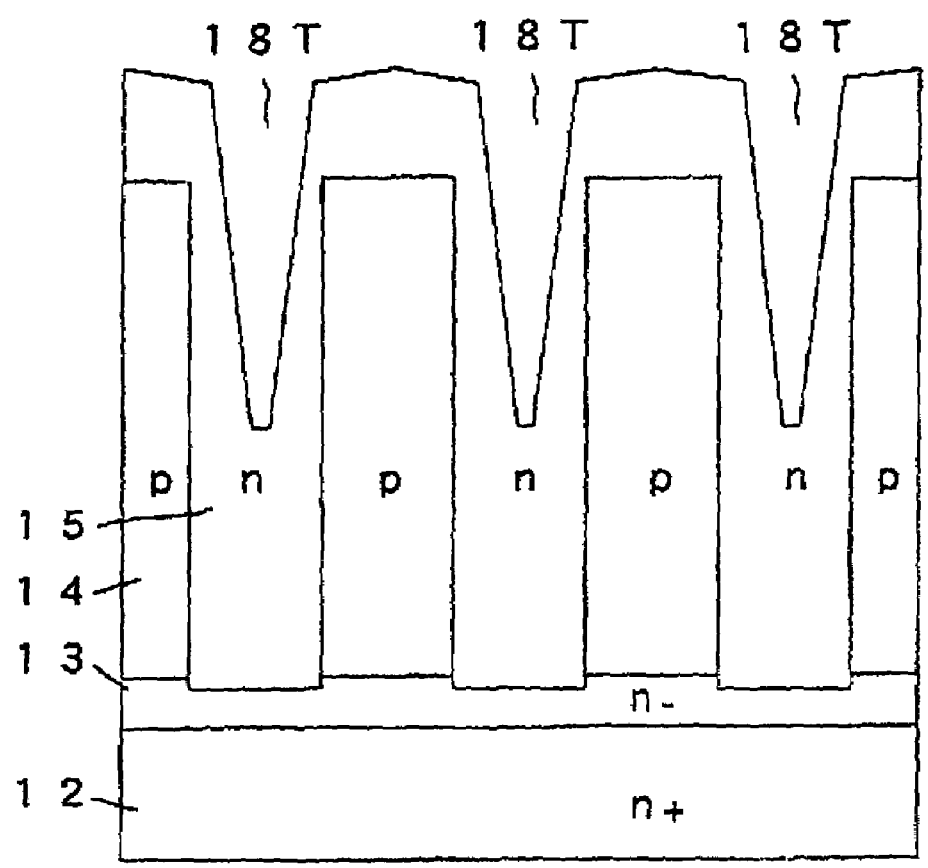
FIG. 4 illustrates a process step of manufacturing the power MOSFET shown in FIG. 1.

Process steps of manufacturing the power MOSFET shown in FIG. 1 are described with reference to FIGS. 2-11. First, on the n$^+$-type drain layer 12, the n$^-$-type epitaxial layer 13 is formed, and a p-type epitaxial layer to be turned into the p-type pillars 14 is formed thereon as shown in FIG. 2. Next, at equal lateral intervals in the p-type epitaxial layer, trenches 15T are formed for use in formation of the n-type pillars 15 as shown in FIG. 3. Subsequently, an n-type epitaxial layer to be turned into the n-type pillars 15 is deposited over the entire surface including the inside of the trenches 15T to such an extent that the trenches 15T are not filled completely and tapered oblique portions 18T are left in the trenches as shown in FIG. 4. As the epitaxial growth is applied to the entire surface including the trench 15T, the downward tip portion of the oblique portion 18T is formed as naturally locating near the center of the trench 15T. Therefore, this process step can reduce the pillar pitch between the pillars without considering the occurrence of a displacement between the gate electrode and the pillar and accordingly can contribute to a reduction in on-resistance of the element.

Figure 5:
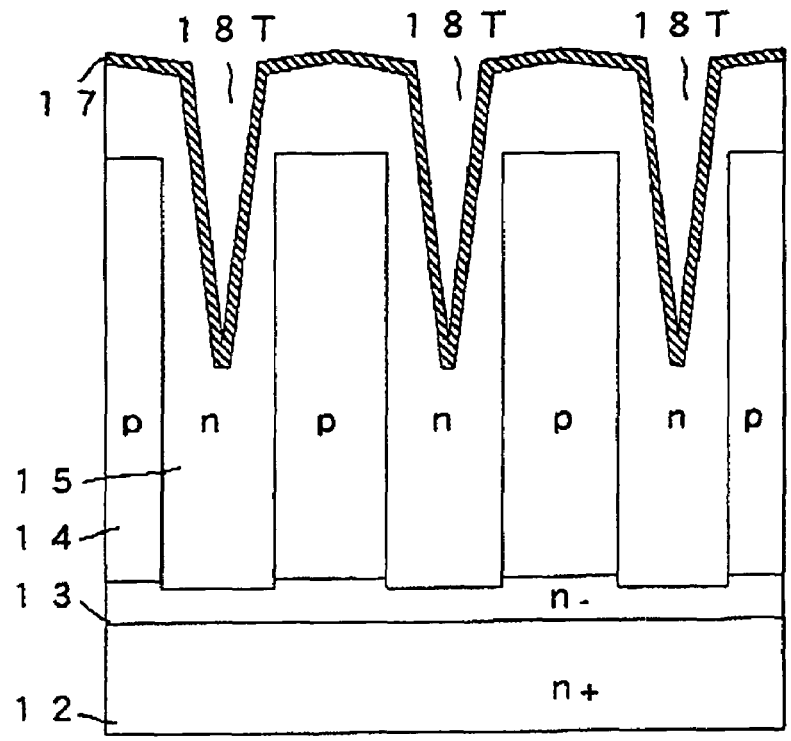
FIG. 5 illustrates a process step of manufacturing the power MOSFET shown in FIG. 1.
Figure 6:
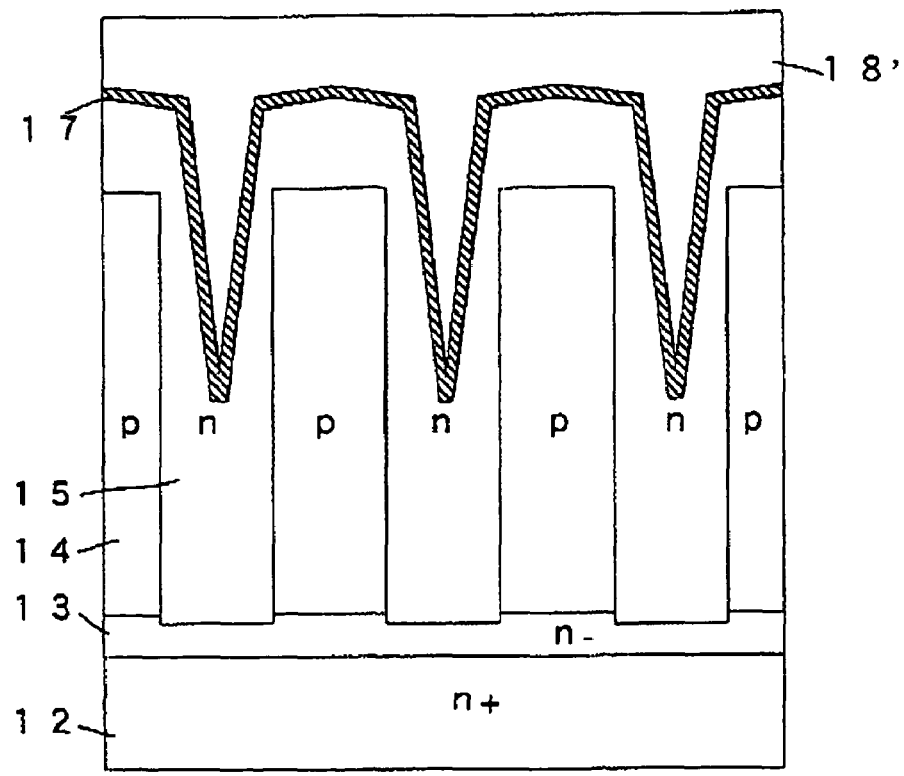
FIG. 6 illustrates a process step of manufacturing the power MOSFET shown in FIG. 1.
Figure 7:
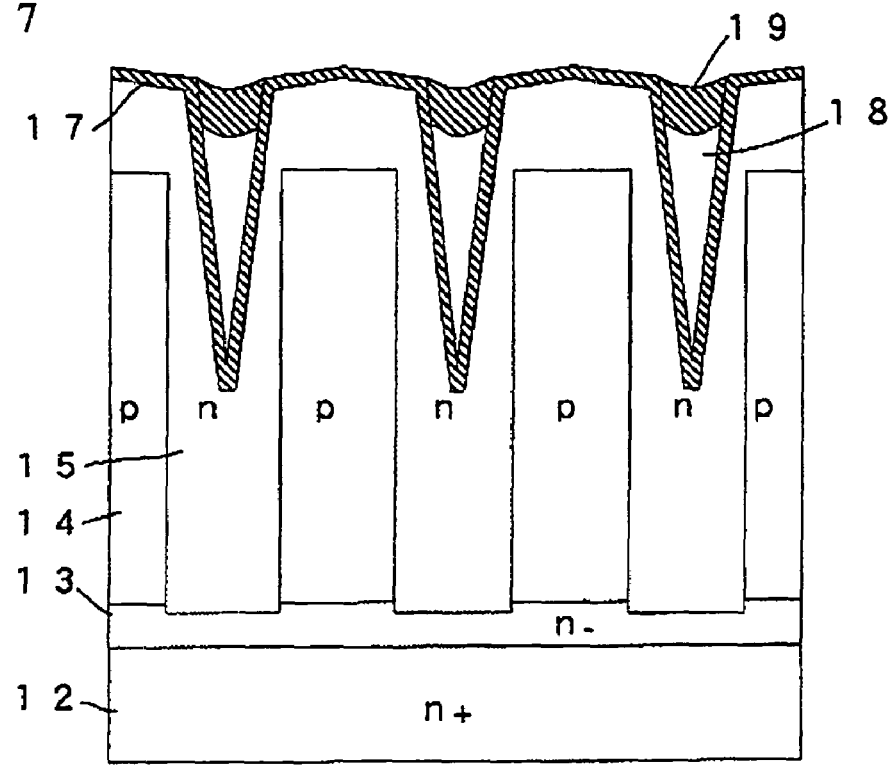
FIG. 7 illustrates a process step of manufacturing the power MOSFET shown in FIG. 1.

Next, on the n-type epitaxial layer including the inside of the tapered oblique portions 18T, as shown in FIG. 5, the insulator film 17 composed of silicon oxide is formed by thermal oxidation. Thereafter, on the insulator film 17 including the inside of the oblique portion 18T, as shown in FIG. 6, a conductor film 18' of polysilicon or the like to be turned into the gate electrode 18 is deposited. The conductor film 18' is removed by etching from the outside of the oblique portion 18T. Then, the insulator film 19 is formed on the oblique portion 18T to form the gate electrode 18 insulated by the insulator films 18 and 19.

Figure 8:
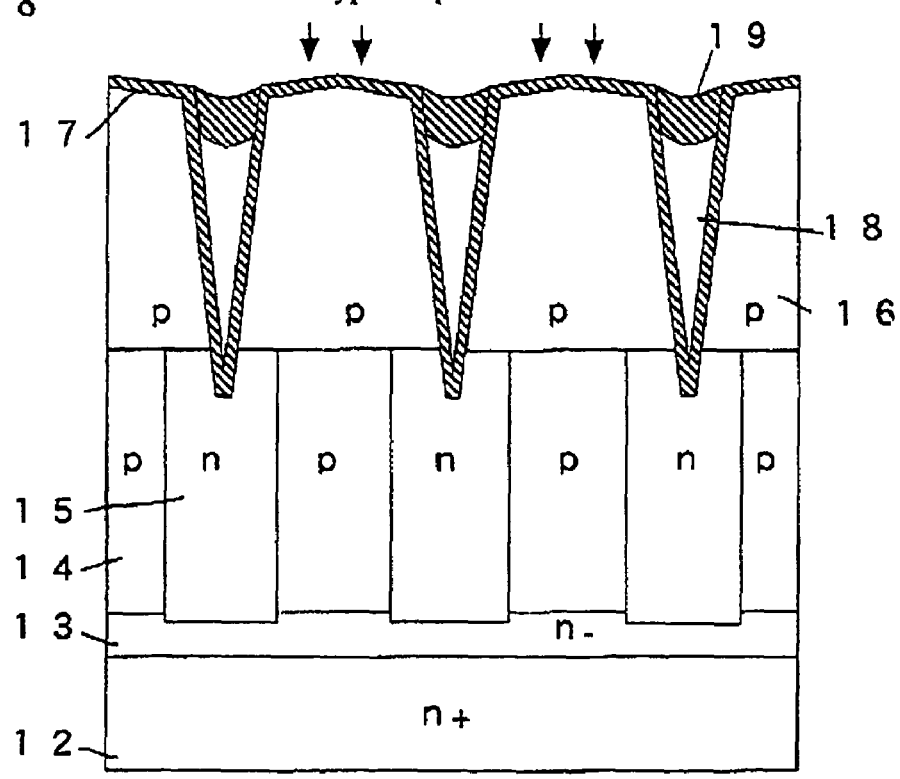
FIG. 8 illustrates a process step of manufacturing the power MOSFET shown in FIG. 1.
Figure 9:
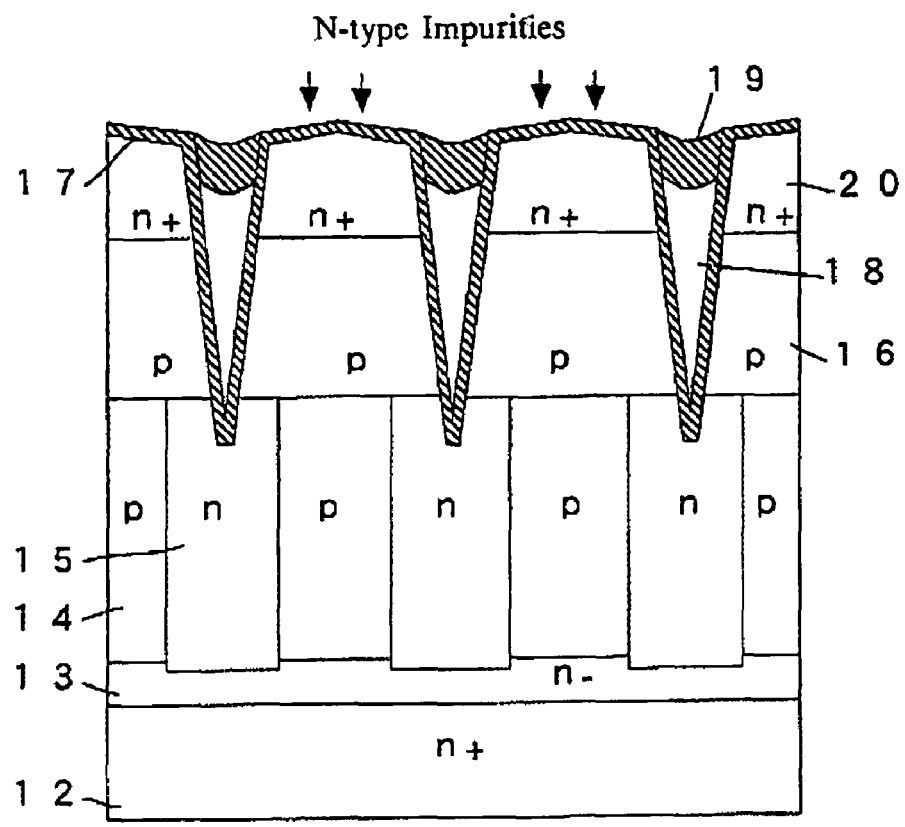
FIG. 9 illustrates a process step of manufacturing the power MOSFET shown in FIG. 1.

Subsequently, ions of p-type and n-type impurities are implanted to the p-type pillars 14 and the n-type pillars 15 sandwiched between the gate electrodes 18. Then, thermal diffusion is applied to form the p-type base layer 16 and the n$^+$-type source diffusion layer 20 as shown in FIGS. 8 and 9. The period of time of thermal diffusion is set such that the lower side of the p-type base layer 16 locates slightly above the tip of the oblique portion 18T.

Figure 10:
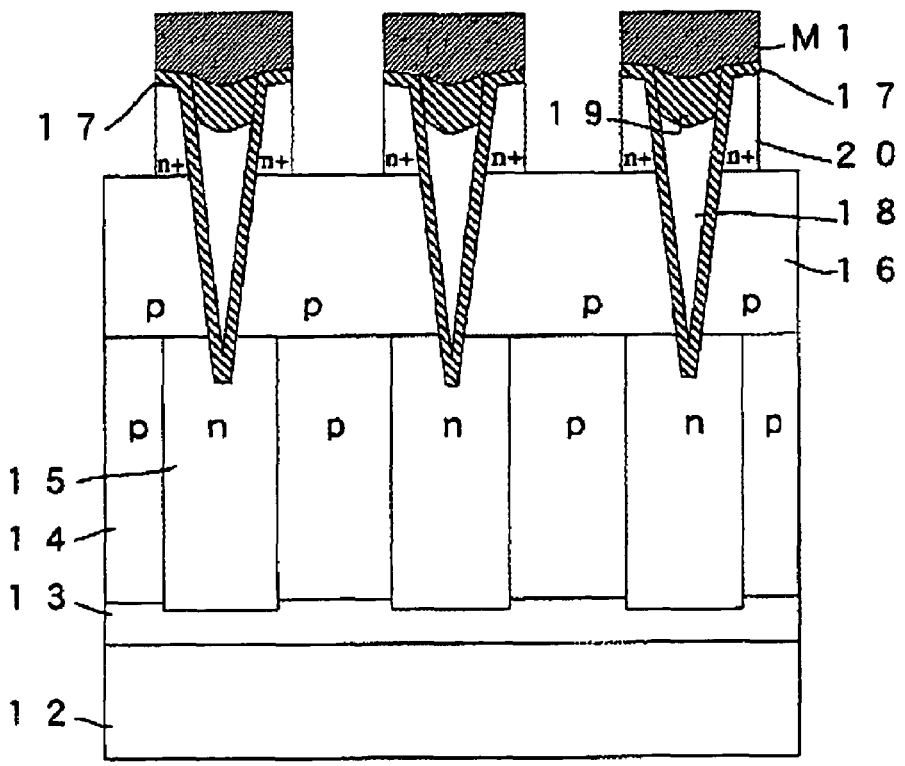
FIG. 10 illustrates a process step of manufacturing the power MOSFET shown in FIG. 1.
Figure 11:
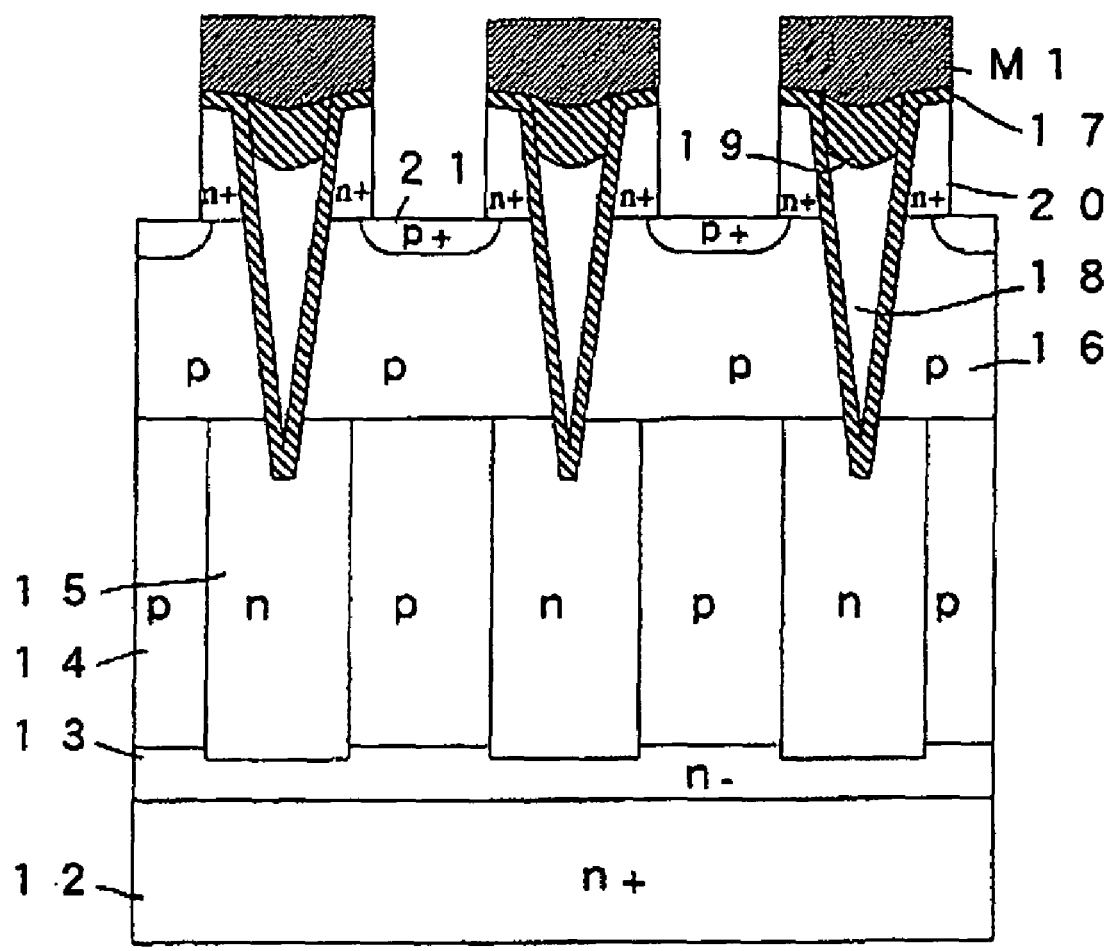
FIG. 11 illustrates a process step of manufacturing the power MOSFET shown in FIG. 1.

Subsequently, a film of resist M1 is formed over the gate electrodes 18 and the insulator film 19 as shown in FIG. 10. This resist M1 is used as a mask to form trenches through the source diffusion layer 20 to the p-type base layer 16. Further, ions of boron are implanted into the p-type base layer 16 with the mask of the resist M1 to form the $p^+$-type contact layer 21 as shown in FIG. 11. Thereafter, a metal film to be turned into the source electrode 22 is formed by spattering in the trenches. Further, the drain electrode 11 is formed on the lower surface of the $n^+$-type drain layer 12 to complete the power MOSFET shown in FIG. 1.

The embodiment of the invention has been described above though the present invention is not limited to the embodiment but rather various modifications and additions can be made without departing from the scope and spirit of the invention. For example, in the above embodiment, the first conduction type is described as n-type and the second first conduction type as p-type though the first conduction type may be implemented as p-type and the second first conduction type as n-type.

Figure 12:
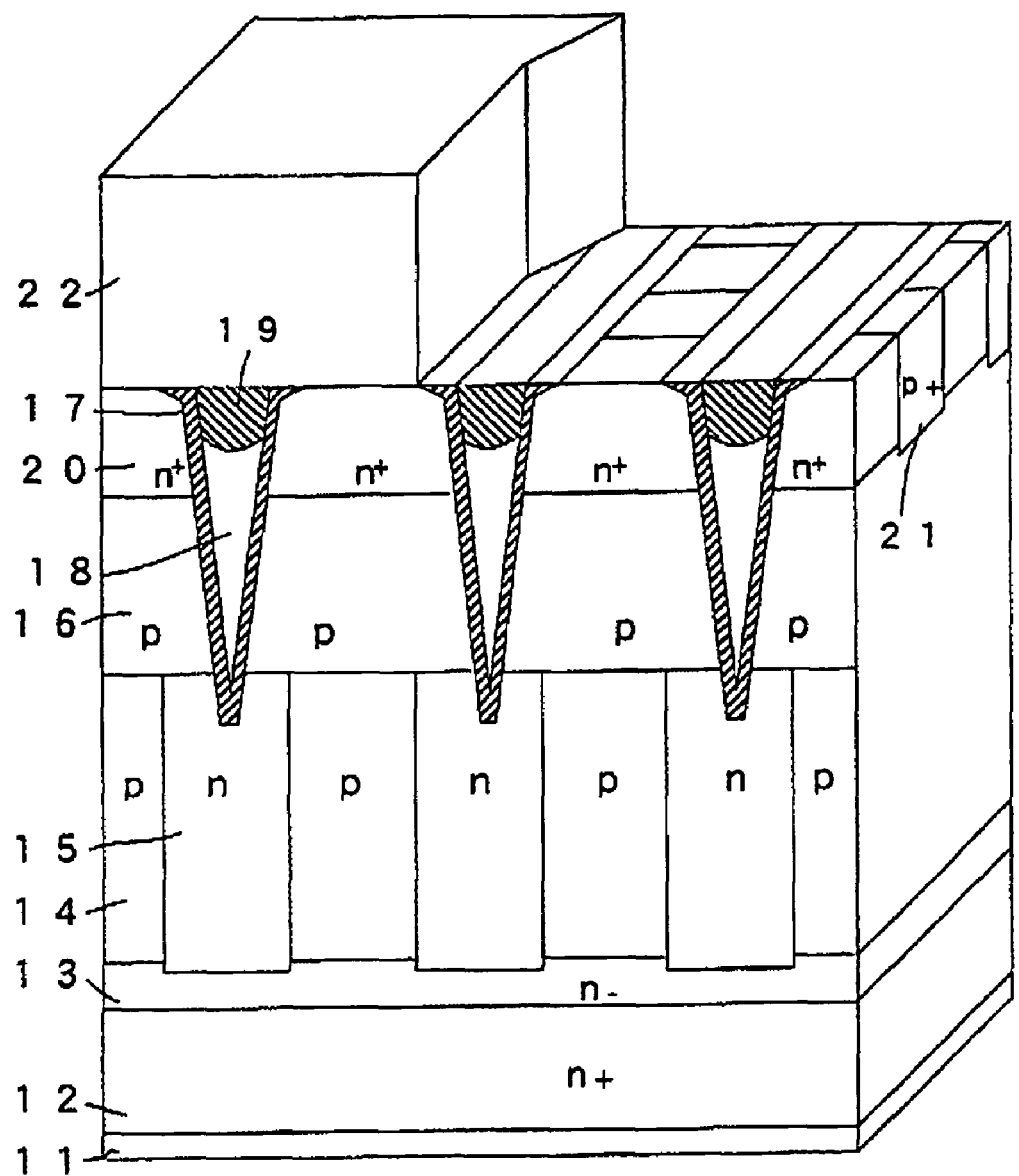
FIG. 12 illustrates a modification of the embodiment of the present invention.

The stripes of the pillars 14, 15 may extend in a direction same as or normal to the direction in which the gate electrode 18 and so forth extend. The $p^+$-type contact layer 21 may be formed to have a longitudinal direction same as the direction in which the pillars 14, 15 and the gate electrode 18 extend or normal to that direction as shown in FIG. 12. The epitaxial layer 13 may be formed by thermal diffusion instead of epitaxial growth.

In the above embodiment, the pillars 14, 15 are formed in stripes in horizontal cross-section though they may be formed in a grid.

The described MOSFET uses silicon as the semiconductor though available semiconductors may include compound semiconductors such as silicon carbide (SiC) and gallium nitride (GaN), and wide bandgap semiconductors such as diamond.

The MOSFET having the superjunction structure is described though the structure of the present invention is also applicable to other superjunction-structured elements such as an SBD, a MOSFET-SBD hybrid element, an SIT, and an IGBT.

What is claimed is:

1. A semiconductor element, comprising:
   a first semiconductor layer of a first conduction type;
   a pillar layer including first semiconductor pillars of the first conduction type and second semiconductor pillars of a second conduction type arranged periodically and alternately on said first semiconductor layer;
   a first main electrode electrically connected to said first semiconductor layer;
   a semiconductor base layer of the second conduction type formed on the upper surface of said pillar layer;
   a second semiconductor layer of the first conduction type formed on the upper surface of said semiconductor base layer;
   a second main electrode electrically connected to said second semiconductor layer and said semiconductor base layer; and
   a control electrode of the trench gate type formed in a trench, said trench formed in depth through said semiconductor base layer to said first semiconductor pillar,
   wherein said control electrode is tapered such that the width thereof decreases with the distance from said second main electrode toward said first main electrode and the tip thereof locates almost at the center of said first semiconductor pillar.

2. The semiconductor element according to claim 1, wherein said pillar layer is formed in stripes in the direction of horizontal cross section.

3. The semiconductor element according to claim 1, wherein said second semiconductor layer is formed along both sides of said control electrode,
   further comprising a contact layer formed in the upper surface of said semiconductor base layer sandwiched between portions of said second semiconductor layer and brought into contact with said second main electrode.

4. The semiconductor element according to claim 1, wherein said pillar layer is formed in stripes in horizontal cross section along a first direction,
   wherein said gate electrode extends in a direction along said first direction.

5. The semiconductor element according to claim 1, wherein said control electrode is formed by forming trenches at equal intervals in a semiconductor layer of the second conduction type formed on said first semiconductor layer, then crystal-growing a semiconductor layer of the first conduction type on said semiconductor layer of the second conduction type so as not to completely fill said trench and leave a tapered oblique portion formed in said trench, and burying a conductor material in said oblique portion with an insulator film interposed therebetween.

6. The semiconductor element according to claim 1, wherein said semiconductor base layer and said second semiconductor layer are formed by implanting ions of an impurity of the second conduction type and implanting ions of an impurity of the first conduction type into said semiconductor layer located between said control electrodes, followed by thermal diffusion.

7. The semiconductor element according to claim 1, wherein said second main electrode is buried in trenches and made into contact with said second semiconductor layer in an almost vertical plane, said trenches formed through said second semiconductor layer to said semiconductor base layer.

8. The semiconductor element according to claim 7, wherein said second main electrode is connected to said semiconductor base layer via a contact layer of the second conduction type formed on the upper surface of said semiconductor base layer.

* * * * *